(12) United States Patent
Brask et al.

(10) Patent No.: US 7,037,845 B2
(45) Date of Patent: May 2, 2006

(54) SELECTIVE ETCH PROCESS FOR MAKING A SEMICONDUCTOR DEVICE HAVING A HIGH-K GATE DIELECTRIC

(75) Inventors: Justin K. Brask, Portland, OR (US); Uday Shah, Portland, OR (US); Mark L. Doczy, Beaverton, OR (US); Jack Kavalieros, Portland, OR (US); Robert S. Chau, Beaverton, OR (US); Robert B. Turkot, Jr., Hillsboro, OR (US); Matthew V. Metz, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 10/652,546

(22) Filed: Aug. 28, 2003

(65) Prior Publication Data

US 2005/0048791 A1 Mar. 3, 2005

(51) Int. Cl.
*H01L 21/302* (2006.01)
(52) U.S. Cl. .................................. 438/710; 438/745
(58) Field of Classification Search ................ 438/706, 438/710, 714, 722, 745, 754, 756, 757
See application file for complete search history.

(56) References Cited

U.S. PATENT DOCUMENTS

| | | | | |
|---|---|---|---|---|
| 4,460,413 A | * | 7/1984 | Hirata et al. ................ 438/297 |
| 5,516,399 A | * | 5/1996 | Balconi-Lamica et al. ...... 438/8 |
| 5,625,217 A | | 4/1997 | Chau et al. ................. 257/412 |
| 5,753,560 A | | 5/1998 | Hong et al. ................ 438/402 |
| 5,783,478 A | | 7/1998 | Chau et al. ................. 438/592 |
| 5,891,798 A | | 4/1999 | Doyle et al. ................ 438/624 |
| 6,063,698 A | | 5/2000 | Tseng et al. ................ 438/585 |
| 6,087,261 A | | 7/2000 | Nishikawa et al. .......... 438/685 |
| 6,121,094 A | | 9/2000 | Gardner et al. ............. 438/287 |
| 6,184,072 B1 | | 2/2001 | Kaushik et al. ............. 438/197 |
| 6,306,742 B1 | | 10/2001 | Doyle et al. ................ 438/591 |
| 6,391,802 B1 | | 5/2002 | Delpech et al. ............. 438/785 |
| 6,420,279 B1 | | 7/2002 | Ono et al. ................... 48/785 |
| 6,436,777 B1 | | 8/2002 | Ota ........................... 438/305 |
| 6,455,330 B1 | * | 9/2002 | Yao et al. ...................... 438/3 |
| 6,475,874 B1 | | 11/2002 | Xiang et al. ................ 438/396 |
| 6,475,974 B1 | * | 11/2002 | Leboucher et al. .......... 510/417 |
| 6,514,828 B1 | | 2/2003 | Ahn et al. ................... 438/297 |
| 6,544,906 B1 | | 4/2003 | Rotondaro et al. .......... 438/785 |
| 6,617,209 B1 | | 9/2003 | Chau et al. ................. 438/240 |

(Continued)

FOREIGN PATENT DOCUMENTS

EP 1 511 073 A1 3/2005

OTHER PUBLICATIONS

Doug Barlage et al., "High-Frequency Response of 100nm Integrated CMOS Transistors with High-K Gate Dielectrics", 2001 IEEE, 4 pages.

(Continued)

*Primary Examiner*—Kin-Chan Chen
(74) *Attorney, Agent, or Firm*—Blakely, Sokoloff, Taylor & Zafman LLP

(57) ABSTRACT

A method for making a semiconductor device is described. That method comprises forming a high-k gate dielectric layer on a substrate, and modifying a first portion of the high-k gate dielectric layer to ensure that it may be removed selectively to a second portion of the high-k gate dielectric layer.

17 Claims, 1 Drawing Sheet

U.S. PATENT DOCUMENTS

| | | | |
|---|---|---|---|
| 6,617,210 B1 | 9/2003 | Chau et al. | 438/240 |
| 6,660,660 B1 * | 12/2003 | Haukka et al. | 438/778 |
| 6,677,254 B1 * | 1/2004 | Narwankar et al. | 438/785 |
| 6,696,327 B1 * | 2/2004 | Brask et al. | 438/197 |
| 6,764,898 B1 * | 7/2004 | En et al. | 438/240 |
| 6,855,639 B1 | 2/2005 | Brask et al. | 438/742 |
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |

OTHER PUBLICATIONS

Robert Chau et al., A 50nm Depleted-Substrate CMOS Transistor (DST), 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

Chau et al., "A Method of Making Semiconductor Device Having a High-K Gate Dielectric", U.S. Appl. No. 10/082,530, filed Feb. 22, 2002.

Parker et al., "A Method of Making Semiconductor Device Having a High-K Gate Dielectric", U.S. Appl. No. 10/285,915, filed Oct. 31, 2002.

Chau et al., "A Method of Making Semiconductor Device Having a High-K Gate Dielectric", U.S. Appl. No. 10/288,043, filed Nov. 5, 2002.

Parker et al., "A Method of Making Semiconductor Device Having a High-K Gate Dielectric", U.S. Appl. No. 10/315,268, filed Dec. 10, 2002.

Doczy et al., "A Method of Making Semiconductor Device Having a High-K Gate Dielectric", U.S. Appl. No. 10/338,174, filed Jan. 7, 2003.

Brask et al., "A Method of Making Semiconductor Device Having a High-K Gate Dielectric", U.S. Appl. No. 10/387,303, filed Mar. 11, 2003.

Brask et al., "A Method of Making Semiconductor Device Having a High-K Gate Dielectric", U.S. Appl. No. 10/391,816, filed Mar. 18, 2003.

Chau et al., "A Method for Making a Semiconductor Device Having a Metal Gate Electrode", U.S. Appl. No. 10/431,166, filed May 6, 2003.

Brask, et al, "A Method for Making a Semiconductor Device Having a High-K Gate Dielectric", U.S. Appl. No. 10/441,616, filed May 20, 2003.

Polishchuk et al., "Dual Workfunction CMOS Gate Technology Based on Metal Interdiffusion," www.eesc.berkeley.edu, 1 page.

* cited by examiner

SELECTIVE ETCH PROCESS FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

Conventional processes for etching high-k gate dielectric layers apply anisotropic plasma etch and isotropic wet etch techniques. Dry etch processes may damage the substrate that lies beneath the high-k gate dielectric, if they etch the substrate at a significantly faster rate than they etch the dielectric. Although wet etch processes may etch the dielectric selective to the underlying substrate, such processes may etch the dielectric where it is located beneath the gate electrode, which may weaken or lift that structure.

Accordingly, there is a need for an improved process for making a semiconductor device that includes a high-k gate dielectric. There is a need for such a process that etches the exposed part of the high-k film selective to the underlying substrate and selective to the part of that film that the gate electrode covers. The method of the present invention provides such a process.

DETAILED DESCRIPTION OF THE PRESENT INVENTION

Figure 1A:
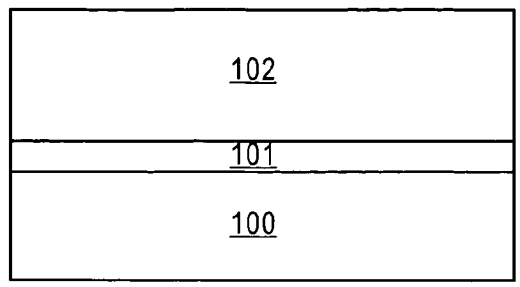
FIGS. 1a–1d represent cross-sections of structures that may be formed when carrying out an embodiment of the method of the present invention. Features shown in these figures are not intended to be drawn to scale.

A method for making a semiconductor device is described. That method comprises forming a high-k gate dielectric layer on a substrate, and modifying a first portion of the high-k gate dielectric layer to ensure that it may be removed selectively to a second portion of the high-k gate dielectric layer. In the following description, a number of details are set forth to provide a thorough explanation of the present invention. It will be apparent to those skilled in the art, however, that the invention may be practiced in many ways other than those expressly described here. The invention is thus not limited by the specific details disclosed below.

In the method of the present invention, a high-k gate dielectric layer is formed on a substrate. The substrate may comprise a bulk silicon or silicon-on-insulator substructure. Alternatively, the substrate may comprise other materials—which may or may not be combined with silicon—such as: germanium, indium antimonide, lead telluride, indium arsenide, indium phosphide, gallium arsenide, or gallium antimonide. Although several examples of materials from which the substrate may be formed are described here, any material that may serve as a foundation upon which a semiconductor device may be built falls within the spirit and scope of the present invention.

The high-k gate dielectric layer will comprise a material with a dielectric constant that is greater than the dielectric constant of silicon dioxide. Preferably, the high-k gate dielectric layer has a dielectric constant that is at least about twice that of silicon dioxide, i.e., a dielectric constant that is greater than about 8. Materials for making the high-k gate dielectric layer include: hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, and lead scandium tantalum oxide. Particularly preferred are hafnium oxide, zirconium oxide, titanium oxide, and aluminum oxide. Although a few examples of materials that may be used to form high-k gate dielectric layer are described here, that layer may be made from other materials, as will be apparent to those skilled in the art.

The high-k gate dielectric layer may be formed on the substrate using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between the substrate and the high-k gate dielectric layer. The CVD reactor should be operated long enough to form a layer with the desired thickness. In most applications, the high-k gate dielectric layer should be less than about 40 angstroms thick, and more preferably between about 5 angstroms and about 20 angstroms thick—i.e., less than or equal to about 5 monolayers thick.

As deposited, the high-k gate dielectric layer may include undesirable impurities, e.g., residual chlorine, which render that layer incompatible with polysilicon. That layer may be purified by depositing a sacrificial layer on its surface, then removing the sacrificial layer after it has absorbed a significant number of the impurities initially present in the high-k gate dielectric layer. Alternatively, the high-k gate dielectric layer may be purified by reducing it to a metal layer, then reoxidizing that metal layer. It may be desirable to increase the oxygen content of the high-k gate dielectric layer, e.g., via a wet or dry oxidation process. To ensure compatibility with a polysilicon based gate electrode, the high-k gate dielectric layer may be modified in other ways, e.g., by adding nitrogen to it, or intermediate layers may be placed between that film and the gate electrode.

Figure 1B:
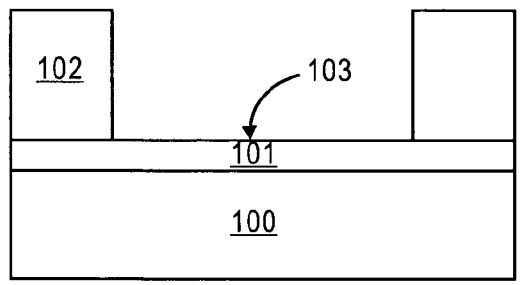

After the high-k gate dielectric layer is formed on the substrate, a gate electrode may be formed on that layer. In a preferred embodiment, the gate electrode comprises polysilicon. Such a gate electrode may be formed by initially depositing polysilicon layer 102 on dielectric layer 101 and substrate 100—generating the FIG. 1a structure. Polysilicon layer 102 may be deposited using conventional methods and preferably is between about 500 angstroms and about 4,000 angstroms thick. Polysilicon layer 102 may then be etched to expose first portion 103 of high-k gate dielectric layer 101, generating the FIG. 1b structure.

Figure 1C:
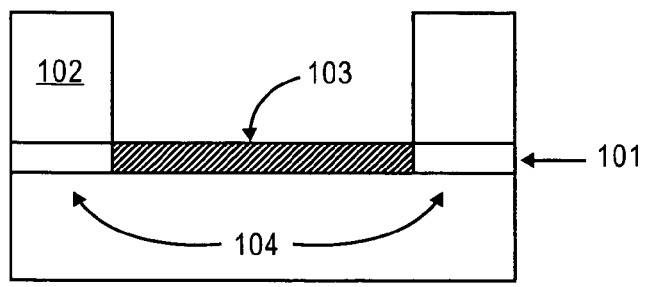

After etching polysilicon layer 102, exposed first portion 103 must be removed. Prior to etching first portion 103, however, the method of the present invention modifies first portion 103, as shown in FIG. 1c, to ensure that it may be removed selectively to second portion 104 of high-k gate dielectric layer 101. First portion 103 of high-k gate dielectric layer 101 may be modified by adding impurities to that portion of the dielectric layer. In a preferred embodiment, the impurities comprise a halogen, which may be embodied in a halogen molecule or be combined with hydrogen to form a halide.

A plasma enhanced chemical vapor deposition ("PECVD") process may be used to add impurities to first portion 103 of high-k gate dielectric layer 101. In such a PECVD process, a halogen or halide gas (or a combination of such gases) may be fed into a reactor prior to striking a plasma. The reactor should be operated under the appropriate conditions (e.g., temperature, pressure, radio frequency, and power) for a sufficient time to modify first portion 103 of high-k gate dielectric layer 101 to ensure that it may be removed selectively to other materials. In a preferred embodiment, a low power PECVD process, e.g., one taking place at less than about 200 watts, is used.

In a particularly preferred embodiment, hydrogen bromide ("HBr") and chlorine ("$Cl_2$") gases are fed into the reactor at appropriate flow rates to ensure that a plasma generated from those gases will modify first portion 103 of high-k gate dielectric layer 101 in the desired manner. Between about 50 and about 100 watts wafer bias (preferably about 100 watts) may be applied for a sufficient time to complete the desired transformation of first portion 103. Plasma exposure lasting less than about one minute, and perhaps as short as 5 seconds, may be adequate to cause that conversion.

Although a few examples of processes for modifying first portion 103 of high-k dielectric layer 101 are described here, other treatments may be used, as will be apparent to those skilled in the art. The process used to modify first portion 103 is thus not limited to those described above. The method of the present invention contemplates using any suitable wet or dry chemical treatment that adds impurities to first portion 103 of high-k dielectric layer 101 to ensure that first portion 103 may be removed selectively to second portion 104 of high-k gate dielectric layer 101.

Figure 1D:
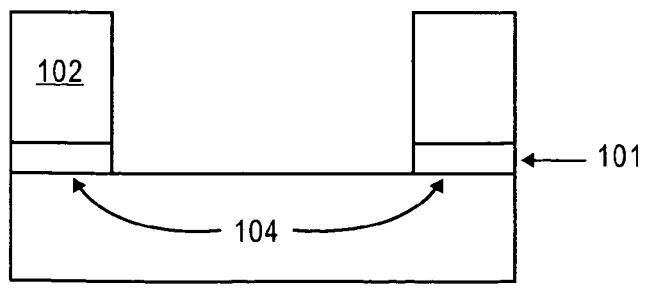

After first portion 103 has been modified, it is removed. The presence of the added impurities enables first portion 103 to be removed, i.e., etched, selectively to second portion 104 to generate the FIG. 1d structure. In a preferred embodiment, first portion 103 is removed by exposing it to a relatively strong acid, e.g., a halide based acid (such as hydrobromic or hydrochloric acid) or phosphoric acid.

When a halide based acid is used, the acid preferably contains between about 0.5% and about 10% HBr or HCl by volume—and more preferably about 5% by volume. An etch process that uses such an acid may take place at or near room temperature, and last for between about 5 and about 30 minutes—although a longer exposure may be used if desired. When phosphoric acid is used, the acid preferably contains between about 75% and about 95% $H_3PO_4$ by volume. An etch process that uses such an acid preferably takes place at between about 140° C. and about 180° C., and more preferably at about 160° C. When such an acid is used, the exposure step should last between about 30 seconds and about 5 minutes—and preferably for about one minute for a 20 angstrom thick film.

Although a few examples of processes for removing first portion 103 selective to second portion 104 are described here, other processes may be used, as will be apparent to those skilled in the art. The process used to etch first portion 103 is thus not limited to those described above. The method of the present invention contemplates using any suitable treatment that removes first portion 103 of high-k dielectric layer 101 selectively to second portion 104 of high-k gate dielectric layer 101.

Because additional steps that are generally used to complete the semiconductor device are well known to those skilled in the art, they will not be described in more detail here. Although the gate electrode preferably comprises polysilicon, it may alternatively be formed from various metals with which high-k gate dielectrics may be used. In addition, the gate electrode may comprise a combination of polysilicon and one or more metal or semi-metal materials.

As described above, modifying first portion 103 of high-k gate dielectric layer 101 anisotropically, leaving adjacent structures unaffected by that process step, may ensure that a subsequent wet etch process will not appreciably etch into the underlying substrate or the adjoining second portion. As a consequence, when this process is used to etch the high-k dielectric layer, the underlying substrate should not sustain any meaningful damage and the gate electrode should not be lifted or undercut to a significant degree.

Although the embodiments described above are examples of processes that may enable a first portion of a high-k gate dielectric layer to be removed selectively to a second portion of that layer, the present invention is not limited to these particular embodiments. The present invention contemplates other processes for transforming part of a high-k gate dielectric layer to enable its selective removal, ensuring that the dielectric layer etch will not significantly damage the underlying substrate or undercut the gate electrode.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
   forming a high-k gate dielectric layer on a substrate; and
   adding impurities to a first portion of the high-k gate dielectric layer to ensure that it may be removed selectively to a second portion of the high-k gate dielectric layer, wherein the impurities comprise a halide.

2. The method of claim 1 wherein the high-k gate dielectric layer is formed by atomic layer chemical vapor deposition, is between about 5 angstroms and about 40 angstroms thick, and comprises a material selected from the group consisting of hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, and lead scandium tantalum oxide.

3. The method of claim 2 further comprising removing the first portion of the high-k gate dielectric layer selective to the second portion of the high-k gate dielectric layer.

4. The method of claim 3 wherein the first portion of the high-k gate dielectric layer is removed selectively to the second portion of the high-k gate dielectric layer by exposing the first portion of the high-k gate dielectric layer to an acid.

5. The method of claim 4 wherein the acid comprises a halide based acid.

6. The method of claim 4 wherein the acid comprises phosphoric acid.

7. The method of claim 1 wherein the impurities comprise a halogen.

8. The method of claim 1 wherein the adding the impurities to the first portion is performed by a plasma enhanced chemical vapor deposition process.

9. A method for making a semiconductor device comprising:
- forming a high-k gate dielectric layer on a substrate;
- forming a gate electrode on the high-k gate dielectric layer;
- etching the gate electrode to expose a first portion of the high-k gate dielectric layer;
- adding impurities to the first portion of the high-k gate dielectric layer, wherein a low power plasma enhanced chemical vapor deposition process is used to add impurities that comprise a mixture of a halogen and a halide; and
- removing the first portion of the high-k gate dielectric layer selective to a second portion of the high-k gate dielectric layer.

10. The method of claim 9 wherein the gate electrode comprises polysilicon.

11. The method of claim 9 wherein the gate electrode is a metal gate electrode.

12. The method of claim 9 wherein the first portion of the high-k gate dielectric layer is removed selectively to the second portion of the high-k gate dielectric layer by exposing the first portion of the high-k gate dielectric layer to an acid that is selected from the group consisting of a halide based acid and phosphoric acid.

13. A method for making a semiconductor device comprising:
- forming a high-k gate dielectric layer on a substrate;
- forming a polysilicon based gate electrode on the high-k gate dielectric layer;
- etching the polysilicon based gate electrode to expose a first portion of the high-k gate dielectric layer;
- applying a plasma enhanced chemical vapor deposition process to add impurities to the first portion of the high-k gate dielectric layer; and then
- exposing the first portion of the high-k gate dielectric layer to an acid that is selected from the group consisting of a halide based acid and phosphoric acid.

14. A method for making a semiconductor device comprising:
- forming a high-k gate dielectric layer on a substrate;
- forming a polysilicon based gate electrode on the high-k gate dielectric layer;
- etching the polysilicon based gate electrode to expose a first portion of the high-k gate dielectric layer;
- applying a plasma enhanced chemical vapor deposition process to add impurities to the first portion of the high-k gate dielectric layer, wherein the plasma enhanced chemical vapor deposition process is performed at less than about 200 watts, and wherein the impurities comprise a mixture of a halogen and halide; and then
- exposing the first portion of the high-k gate dielectric layer to an acid that is selected from the group consisting of a halide based acid and phosphoric acid.

15. The method of claim 14 wherein the acid comprises hydrobromic acid or hydrochloric acid, and the impurities comprise a mixture of hydrogen bromide and chlorine.

16. The method of claim 15 wherein the first portion of the high-k gate dielectric layer is exposed to the acid at approximately room temperature for between about 5 minutes and about 30 minutes.

17. The method of claim 14 wherein the plasma enhanced chemical vapor deposition process is performed for less than about one minute.

* * * * *